(12) United States Patent
Ng et al.

(10) Patent No.: US 10,420,042 B2
(45) Date of Patent: *Sep. 17, 2019

(54) QUICK-START HIGH-VOLTAGE BOOST

(71) Applicant: SKYWORKS SOLUTIONS, INC., Woburn, MA (US)

(72) Inventors: Wendy Ng, Los Gatos, CA (US); Yin Chun Yeung, San Jose, CA (US); Michael Lee Scheel, San Jose, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/445,730

(22) Filed: Feb. 28, 2017

(65) Prior Publication Data

US 2017/0181106 A1  Jun. 22, 2017

Related U.S. Application Data

(62) Division of application No. 15/042,330, filed on Feb. 12, 2016, now Pat. No. 9,584,012.

(Continued)

(51) Int. Cl.
  *H02M 1/00* (2006.01)
  *H02M 1/08* (2006.01)
  (Continued)

(52) U.S. Cl.
  CPC ............. *H04W 52/36* (2013.01); *H02M 1/08* (2013.01); *H02M 1/14* (2013.01); *H02M 1/36* (2013.01);
  (Continued)

(58) Field of Classification Search
  CPC ......... H04W 52/36; H02M 1/08; H02M 1/14; H02M 1/36; H02M 3/156;
  (Continued)

(56) References Cited

U.S. PATENT DOCUMENTS 9,584,012 B2 * 2/2017 Ng .................... H02M 3/155
2006/0250115 A1 * 11/2006 Johnson ................. H02J 3/387
322/58

(Continued)

FOREIGN PATENT DOCUMENTS

CN   201805351    4/2011
CN   102055327    5/2011
(Continued)

*Primary Examiner* — Nguyen T Vo
(74) *Attorney, Agent, or Firm* — Chang & Hale LLP

(57) ABSTRACT

In one implementation, a voltage boost assembly including a boost converter having a capacitive element arranged at an output, and an inductive element connectable to an electrical supply. The voltage boost assembly also includes a sensor assembly provided to generate a quick-start enable signal in response to detecting that an electrical condition relative to an electrical output of the boost converter has breached a first threshold. The voltage boost assembly further includes a quick-start module responsive to the quick-start enable signal, and configured to drive the boost converter at a relatively high duty-cycle and so that the boost converter delivers an output current that satisfies a second threshold in order to charge the capacitive element arranged at the output.

13 Claims, 7 Drawing Sheets

Related U.S. Application Data

(60) Provisional application No. 62/116,415, filed on Feb. 14, 2015.

(51) Int. Cl.
| | |
|---|---|
| *H02M 1/14* | (2006.01) |
| *H02M 1/36* | (2007.01) |
| *H03F 1/02* | (2006.01) |
| *H03F 1/32* | (2006.01) |
| *H03F 3/19* | (2006.01) |
| *H03F 3/24* | (2006.01) |
| *H04B 1/38* | (2015.01) |
| *H02M 3/155* | (2006.01) |
| *H02M 3/156* | (2006.01) |
| *H04W 52/36* | (2009.01) |

(52) U.S. Cl.
CPC ........... *H02M 3/155* (2013.01); *H02M 3/156* (2013.01); *H03F 1/0211* (2013.01); *H03F 1/32* (2013.01); *H03F 3/19* (2013.01); *H03F 3/24* (2013.01); *H03F 3/245* (2013.01); *H04B 1/38* (2013.01); *H02M 2001/0009* (2013.01); *H03F 2200/451* (2013.01)

(58) Field of Classification Search
CPC .. H02M 2001/0009; H03F 1/32; H03F 3/245; H04B 1/38
See application file for complete search history.

(56) References Cited

U.S. PATENT DOCUMENTS

| | | | |
|---|---|---|---|
| 2009/0295355 A1* | 12/2009 | Hirahara | H02M 3/157 323/284 |
| 2015/0229202 A1* | 8/2015 | Varigonda | H02M 1/32 323/282 |

FOREIGN PATENT DOCUMENTS

| | | |
|---|---|---|
| CN | 104066234 | 9/2014 |
| CN | 104242623 | 12/2014 |
| WO | 2013/176647 | 11/2013 |

* cited by examiner

QUICK-START HIGH-VOLTAGE BOOST

CROSS-REFERENCE TO RELATED APPLICATION(S)

This application is a divisional of U.S. application Ser. No. 15/042,330, filed Feb. 12, 2016, entitled QUICK-START HIGH-VOLTAGE BOOST, which claims priority to U.S. Provisional Application No. 62/116,415 filed Feb. 14, 2015, entitled QUICK-START HIGH-VOLTAGE BOOST, the disclosure of which is hereby expressly incorporated by reference herein in its entirety.

BACKGROUND

Field

The present disclosure relates to power amplifiers in radio-frequency (RF) applications.

Description of the Related Art

Power amplifiers (PAs) are widely used in various communication networks to set the transmission power level of an information-bearing signal transmitted by one device to another device. For example, power amplifiers are used to set the pulse energy emitted by pulsed lasers in optical communication networks. Power amplifiers are also used in the radio frequency (RF) front-end components of wireless carrier network devices—such as base stations, repeaters, and mobile client devices (e.g. mobile phones, smartphones, tablet computers, etc.)—to set the power level of a wireless signal transmitted through an antenna. PAs are also used in local area networks of homes and offices to support both wired and wireless connectivity of servers, computers, laptops, and peripheral devices such as photocopiers and printers.

In some implementations, PAs use a boost converter for DC-to-DC power conversion when the PAs output voltage should be greater than its input voltage. Typically, a boost converter with a compensated error-amplifier has an intrinsic soft-start feature. With the capacitor at the error-amplifier output slowly being charged up, the duty cycle of the boost is slowly increased, leading to a slow increase of the boost output voltage. In some implementations, in order to use a boost converter to power a high-voltage PA, the boost converter is specified to ramp up at a rate of 570 mV/µs in order to avoid any signal distortion at the output of the PA. The fast ramp-rate of the boost output voltage not only limits the value of the output capacitor, but also posts a challenge on circuit design and architecture to work against the slow soft-start nature of the error amplifier.

SUMMARY

In accordance with a number of implementations, the present disclosure relates to a voltage boost assembly including a boost converter having a capacitive element arranged at an output, and an inductive element connectable to an electrical supply. The voltage boost assembly also includes a sensor assembly provided to generate a quick-start enable signal in response to detecting that an electrical condition relative to an electrical output of the boost converter has breached a first threshold. The voltage boost assembly further includes a quick-start module responsive to the quick-start enable signal, and configured to drive the boost converter at a relatively high duty-cycle and so that the boost converter delivers an output current that satisfies a second threshold in order to charge the capacitive element arranged at the output.

In some implementations, the inductive element is provided to establish an output current level.

In some implementations, detecting that an electrical condition relative to an electrical output of the boost converter has breached the first threshold includes detecting that a reference voltage indicates demand for an electrical output (e.g., an output voltage) that is at least 10% higher than the current electrical output of the boost converter.

In some implementations, detecting that an electrical condition relative to an electrical output of the boost converter has breached the first threshold includes detecting that a reference voltage indicates demand for an electrical output (e.g., an output voltage) that is at least 20% higher than the current electrical output of the boost converter.

In some implementations, the quick-start module includes a charging circuit provided to charge the capacitive element so that an electrical output (e.g., an output voltage) of an associated error amplifier satisfies a third threshold in response to the quick-start enable signal. In some implementations, the third threshold is characterized in relation to a high voltage level that can be sustained at the output of the error amplifier.

In some implementations, the quick-start module includes a saturation limiting circuit provided to limit current through the inductive element to establish the output current in response to the quick-start enable signal. In some implementations, the current through the inductive element is limited to a level that is characterized by a saturation condition of the inductive element.

In some implementations, the quick-start module includes a ripple control module provided to reduce current ripple in the output current level by adjustment of a switching frequency in response to the quick-start enable signal. In some implementations, the ripple control module includes an oscillator that provides a switching frequency that is increased in response to the quick-start enable signal.

In some implementations, the second threshold is characterized by a current level available to charge the capacitive element.

In some implementations, the sensor assembly is configured to turn off the quick-start enable signal in response to determining that the electrical output of the boost converter has satisfied a fourth threshold. In some implementations, the fourth threshold is approximately 95% of a set-point output level.

In some implementations, the present disclosure relates to a module that includes a packaging substrate configured to receive a plurality of components. The module also includes a power amplifier. The module further includes a voltage boost assembly, including a boost converter configured for a power amplifier included on at least a portion of the substrate, the boost converter having a capacitive element arranged at the output, and an inductive element connectable to an electrical supply. The voltage boost assembly also includes a sensor assembly provided to generate a quick-start enable signal in response to detecting that an electrical condition relative to an electrical output of the boost converter has breached a first threshold. The voltage boost assembly further includes a quick-start module responsive to the quick-start enable signal, and configured to drive the boost converter at a relatively high duty-cycle and so that the boost converter delivers an output current that satisfies a second threshold in order to charge the capacitive element arranged at the output.

In some implementations, the quick-start module includes a charging circuit provided to charge the capacitive element so that the output of an associated error amplifier satisfies a third threshold in response to the quick-start enable signal.

In some implementations, the quick-start module includes a saturation limiting circuit provided to limit current through the inductive element coupled to establish the output current level in response to the quick-start enable signal.

In some implementations, the quick-start module includes a ripple control module provided to reduce current ripple in the output current level by adjustment of a switching frequency in response to the quick-start enable signal.

In some implementations, the quick-start module is configured to turn off the quick-start enable signal in response to determining that the electrical output of the boost converter has satisfied a third threshold.

In some implementations, the module is at least one of a power amplifier module (PAM) or a front-end module (FEM). In accordance with some implementations, the voltage boost assembly of the module includes the functions and/or features of any of the voltage boost assemblies described herein.

According to some teachings, the present disclosure relates to a radio-frequency (RF) device that includes a transceiver generate to an RF signal. The RF device also includes a front-end module (FEM) in communication with the transceiver, the FEM including a packaging substrate configured to receive a plurality of components, the FEM further including a voltage boost assembly on the packaging substrate, the voltage boost assembly including a boost converter having a capacitive element arranged at the output, and an inductive element connectable to an electrical supply a sensor assembly provided to generate, the voltage boost assembly also including a quick-start enable signal in response to detecting that an electrical condition relative to an electrical output of the boost converter has breached a first threshold, and the voltage boost assembly further including a quick-start module responsive to the quick-start enable signal, and configured to drive the boost converter at a relatively high duty-cycle and so that the boost converter delivers an output current that satisfies a second threshold in order to charge the capacitive element arranged at the output. The RF device further includes an antenna in communication with the FEM, the antenna configured to transmit the amplified RF signal.

In some implementations, the RF device includes a wireless device. In some implementations, the wireless device includes at least one of a base station, a repeater, a cellular phone, a smartphone, a computer, a laptop, a tablet computer, and a peripheral device. In accordance with some implementations, the voltage boost assembly of the FEM module includes the functions and/or features of any of voltage boost assemblies described herein.

According to some teaching, the present disclosure relates to a method of ramping up the output of a boost converter. The method includes sensing that an electrical condition relative to an electrical output of the boost converter has breached a first threshold. The method further also generating a quick-start enable signal in response to sensing the breach of the first threshold. The method further includes driving a boost converter to deliver an output current that satisfies a second threshold in order to charge a capacitive element arranged at the output of the boost converter by charging the capacitive element so that the output of an associated error amplifier satisfies a third threshold, limiting the current through an inductive element coupled to a supply, and increasing a switching frequency in order to reduce ripple.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
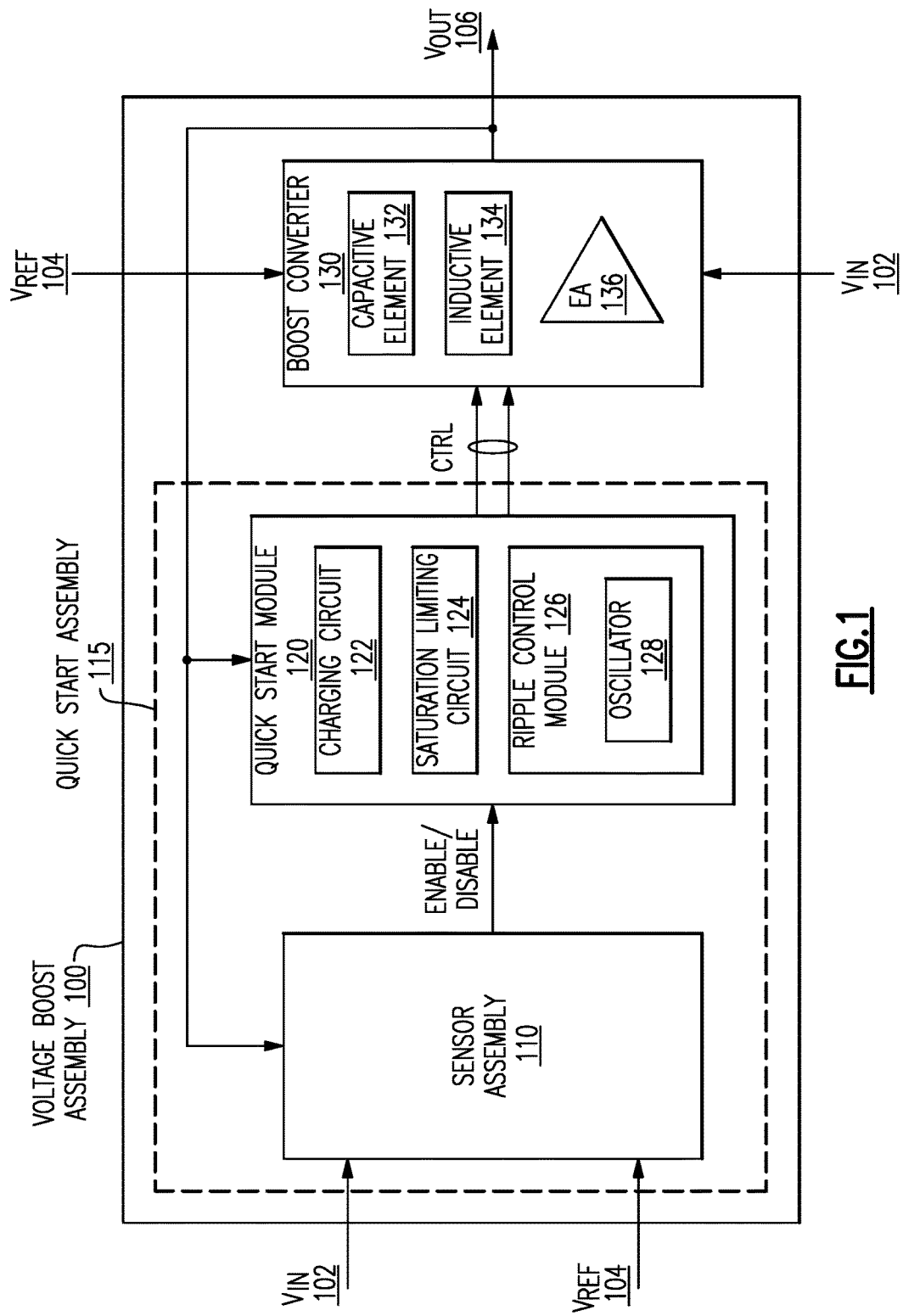
FIG. 1 is a block diagram of a voltage boost assembly according to some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION OF SOME IMPLEMENTATIONS

The headings provided herein, if any, are for convenience only and do not necessarily affect the scope or meaning of the claimed invention.

As discussed above, in order to use a boost converter to power a high-voltage PA, a boost converter is specified to ramp up at a rate of 570 mV/µs in order to avoid any signal distortion at the output of the PA. In order to ramp up the boost output voltage quickly, for example, a 1 µF capacitor is used as the output capacitor. According to some implementations, when the reference voltage $V_{REF}$ from the controller interface (e.g., MIPI) requests that $V_{OUT}$ be higher than $V_{IN}$, and 20% higher than the current output voltage value, the boost converter activates a quick-start module.

In some implementations, the quick-start circuit module includes at least one of a charging circuit, a saturation limiting circuit, or a ripple control module. In some implementations, the quick-start circuit module includes a charging circuit with a current source that is turned on to force the output voltage of the error amplifier satisfy a predefined value (e.g., 1.1 V or 1.2 V). In other words, the charging circuit requests the boost converter to run at maximum duty-cycle. In some implementations, the quick-start circuit module includes a saturation limiting circuit which sets the current-limit of the boost converter to a predetermined level (e.g., 2.5 A) to prevent an inductive element of the boost converter from being saturated. In other words, the saturation limiting circuit allows enough current into the output. In some implementations, the quick-start circuit module includes a ripple control module which increases the switching frequency of the boost converter above a predetermined switching frequency (e.g., from 2 MHz to 2.5 MHz) to achieve lower ripple through the inductive element.

In some implementations, when the output voltage of the boost converter is sensed to reach 95% of its set-point, the quick-start module is turned off. The quick-start module allows the boost to be operated at high duty-cycle, pumping a maximum amount of current to charge the capacitor at the boost output.

FIG. 1 is a block diagram of a voltage boost assembly 100 according to some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, in some implementations, the voltage boost assembly 100 includes a quick-start assembly 115 and a boost converter 130. According to some implementations, the quick-start assembly 115 includes a sensor assembly 110 and a quick-start module 120.

In some implementations, the sensor assembly 110 is configured to provide an enable signal to the quick-start module 120 when one or more predetermined quick-start enable conditions are satisfied. In one example, the quick-start enable conditions are satisfied when $V_{IN}$ 102<$V_{REF}$ 104 and 0.8*$V_{REF}$ 104>$V_{OUT}$ 106. In some implementations, the sensor assembly 110 is configured to provide a disable signal to the quick-start module 120 when one or more predetermined quick-start disable conditions are satisfied. In one example, the quick-start disable conditions are satisfied when 0.95*$V_{REF}$ 104<$V_{OUT}$ 106 or $V_{IN}$ 102>$V_{REF}$ 104.

In some implementations, the quick-start module 120 includes a charging circuit 122, a saturation limiting circuit 124, and a ripple control module 126. In some implementations, the boost converter 130 includes a capacitive element 132, an inductive element 134, and an error amplifier 136. In some implementations, the inductive element 134 is provided to establish an output current level.

According to some implementations, the charging circuit 122 is configured to force the output of the error amplifier 136 to satisfy a predefined value (e.g., 1.1 V or 1.2 V). For example, in some implementations, this forces the error amplifier 136 to run at a duty cycle that satisfies a predefined threshold (e.g., 100% or maximum duty cycle). According to some implementations, the saturation limiting circuit 124 is configured to set a limit of the current flowing through the inductive element 134 to a predetermined output level (e.g., 2.5 A). For example, in some implementations, this prevents saturation of the inductive element 134. According to some implementations, the ripple control module 126 is configured to increase the switching frequency of an oscillator 128 above a predetermined switching frequency (e.g., from 2 MHz to 2.5 MHz). For example, in some implementations, this reduces ripple in the current flowing through the inductive element 134.

Figure 2:
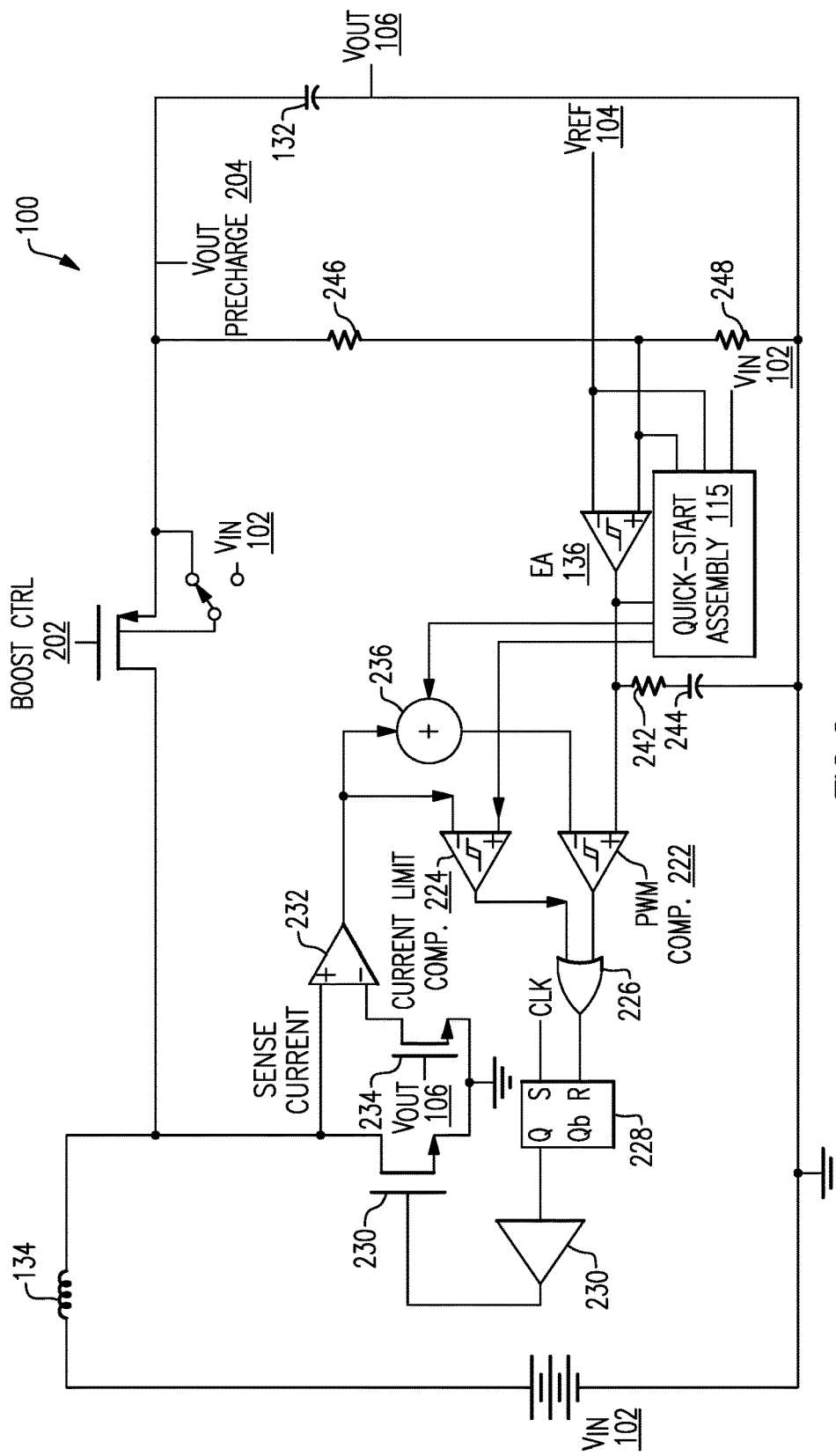
FIG. 2 is a schematic diagram of the voltage boost assembly in FIG. 1 according to some implementations.

FIG. 2 is a schematic diagram of the voltage boost assembly 100 in FIG. 1 according to some implementations. While pertinent features are shown, those of ordinary skill in the art will appreciate from the present disclosure that various other features have not been illustrated for the sake of brevity and so as not to obscure more pertinent aspects of the example implementations disclosed herein. Elements common to FIGS. 1-2 include common reference numbers, and only the differences between FIGS. 1-2 are described herein for the sake of brevity. To that end, in some implementations, the voltage boost assembly 100 includes resistive elements 246 and 248, $V_{OUT}$ precharge 204 (e.g., the output voltage prior to the capacitive element 132), and $V_{OUT}$ 106 (e.g., the output voltage after the capacitive element 132). In some implementations, the voltage boost assembly 100 includes a boost control 202 associated with a p-channel field-effect transistor (PFET) (e.g., with $R_{ds}$=0.27Ω), which acts as a switch to enable and disable the voltage boost assembly 100. According to some implementations, the value of the inductive element 134 is, for example, 1.5 μH, and the value of the capacitive element 132 is, for example, 1 μF.

As shown in FIG. 2, in some implementations, the quick-start assembly 115 is coupled with the output of error amplifier 136. For example, as discussed above with reference to FIG. 1, the quick-start assembly 115 or a component thereof (e.g., the charging circuit 122 in FIG. 1) is configured to force the output of the error amplifier 136 to satisfy a predefined value (e.g., 1.1 V or 1.2 V).

As shown in FIG. 2, in some implementations, the quick-start assembly 115 provides an input to current limit comparator 224. For example, as discussed above with reference to FIG. 1, the quick-start assembly 115 or a component thereof (e.g., the saturation limiting circuit 124 in FIG. 1) is configured to set a limit of the current flowing through the inductive element 134 to a predetermined output level (e.g., 2.5 A).

As shown in FIG. 2, in some implementations, the quick-start assembly 115 provides an input to summation element 236 to compensate for the oscillator slope. For example, as discussed above with reference to FIG. 1, the quick-start assembly 115 or a component thereof (e.g., the ripple control module 126 in FIG. 1) is configured to increase the switching frequency above a predetermined switching frequency (e.g., from 2 MHz to 2.5 MHz).

As shown in FIG. 2, in some implementations, the output of the error amplifier 136 provides an input to pulse-width modulation (PWM) comparator 222. The output of the error amplifier 136 is also coupled with a shunt resistance element 242 (e.g., 80 kΩ) and a shunt capacitance element 244 (e.g., 100 pF), which are connected in series to ground. The output of the PWM comparator 222 provides an input to OR gate 226, and the output of the current limit comparator 224 provides another input to the OR gate 226.

As shown in FIG. 2, in some implementations, the output of the OR gate 226 provides an input to SR latch 228 (e.g., the R input) along with a clock (CLK) signal (e.g., the S input). The output of the SR latch 228 (e.g., the Q output) provides an input to a driver amplifier 230. The output of the driver amplifier 230 is coupled with the gate of an n-channel field-effect transistor (NFET) (e.g., with $R_{ds}$=0.15Ω) 230. The source of the NFET 230 is coupled with the output of the inductive element 134, and the drain of the NFET 230 is coupled with ground.

As shown in FIG. 2, in some implementations, the output of the inductive element 134 provides an input to differential amplifier 232. The source of NFET 234 provides another input to the differential amplifier 232. As shown in FIG. 2, in some implementations, the gate of NFET 234 is coupled with $V_{OUT}$ 106, and the drain of NFET 234 is coupled with ground. The output of the differential amplifier 232 provides an input to the current limit comparator 224 and the summation element 236.

Figure 3:
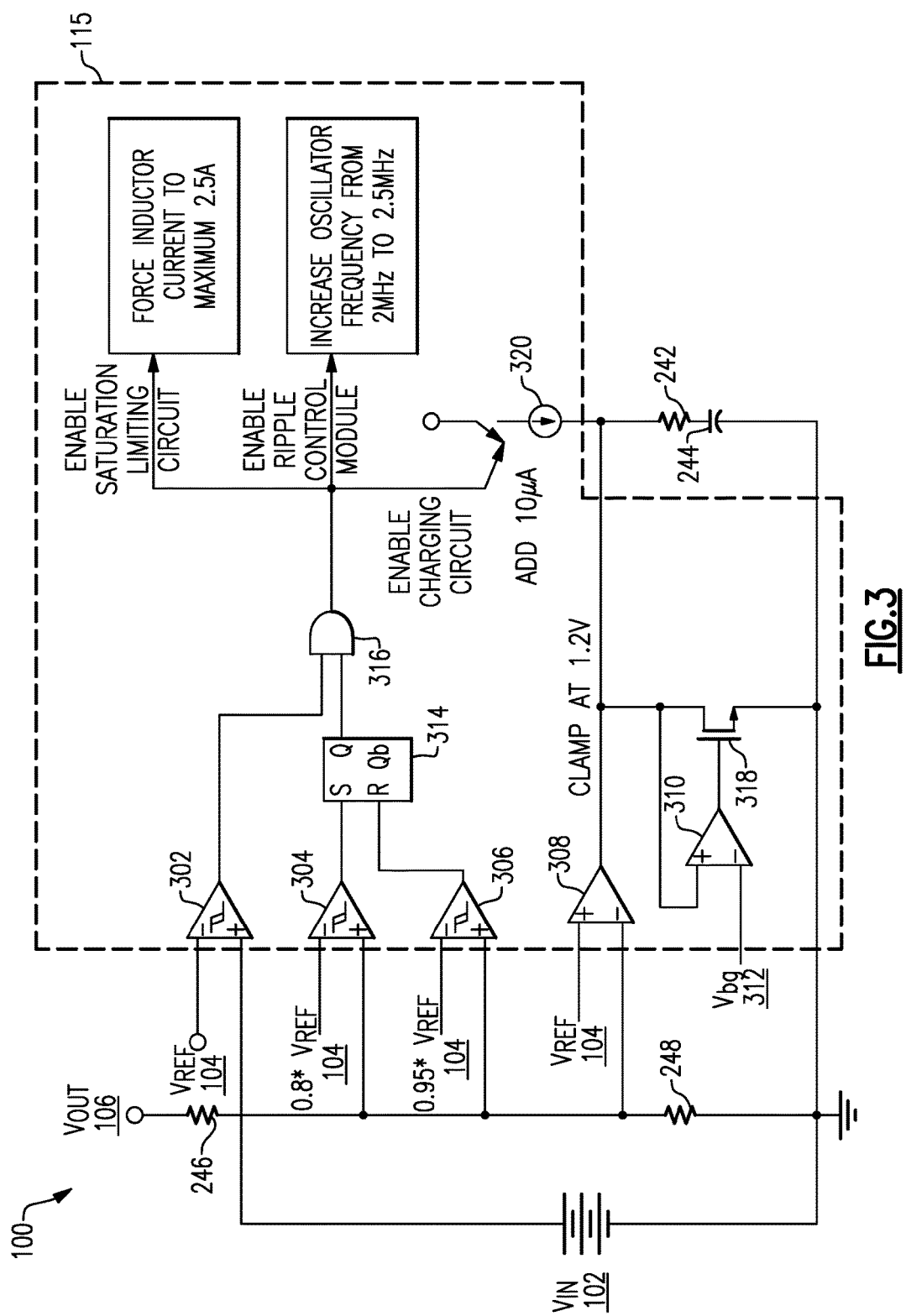
FIG. 3 is a schematic diagram of a portion of the voltage boost assembly in FIG. 1 according to some implementations.

FIG. 3 is a schematic diagram of a portion of the voltage boost assembly 100 in FIG. 1 according to some implementations. While pertinent features are shown, those of ordinary skill in the art will appreciate from the present disclosure that various other features have not been illustrated for the sake of brevity and so as not to obscure more pertinent aspects of the example implementations disclosed herein. Elements common to FIGS. 1-3 include common reference numbers, and only the differences between FIGS. 1-3 are described herein for the sake of brevity. To that end, in some implementations, the quick-start assembly 115: includes comparators 302, 304, and 306; differential amplifiers 308 and 310; SR latch 314; AND gate 316; NFET 318; and current source 320.

As shown in FIG. 3, in some implementations, the comparators 304 and 306 provide inputs to the SR latch 314 (e.g., the S and R inputs, respectively). As shown in FIG. 3, in some implementations, the comparator 302 and the SR latch 314 (e.g., the Q output) provide inputs to the AND gate 316. When $V_{IN}$ 102<$V_{REF}$ 104 and 0.8*$V_{REF}$ 104>$V_{OUT}$ 106, the output of the AND gate 316 is logic high (e.g., 1) and the voltage boost assembly 100 operates under quick-start parameters. Under quick-start parameters, (A) the current flowing through the inductive element 134 is set to a predetermined output level (e.g., 2.5 A), (B) the switching frequency is increased above a predetermined switching frequency (e.g., from 2 MHz to 2.5 MHz), and (C) the current source 320 supplies a predefined current (e.g., 10 µA) so that the output of the error amplifier 136 to satisfy a predefined value (e.g., 1.1 V or 1.2 V). When $V_{IN}$ 102>$V_{REF}$ 104 or 0.95*$V_{REF}$ 104<$V_{OUT}$ 106, the output of the AND gate 316 is logic low (e.g., 0) and the voltage boost assembly 100 operates under regular parameters.

As shown in FIG. 3, in some implementations, $V_{REF}$ 104 and $V_{OUT}$ 106 provide inputs to the differential amplifier 308. The output of the differential amplifier 308 and $V_{bg}$ 312 provide inputs to the differential amplifier 310. The output of the differential amplifier 310 is coupled to the gate of NFET 318. In other words, in one example, the NFET 318 and differential amplifiers 308 and 310 clamp the output of the error amplifier 136 at 1.2 V.

Figure 4:
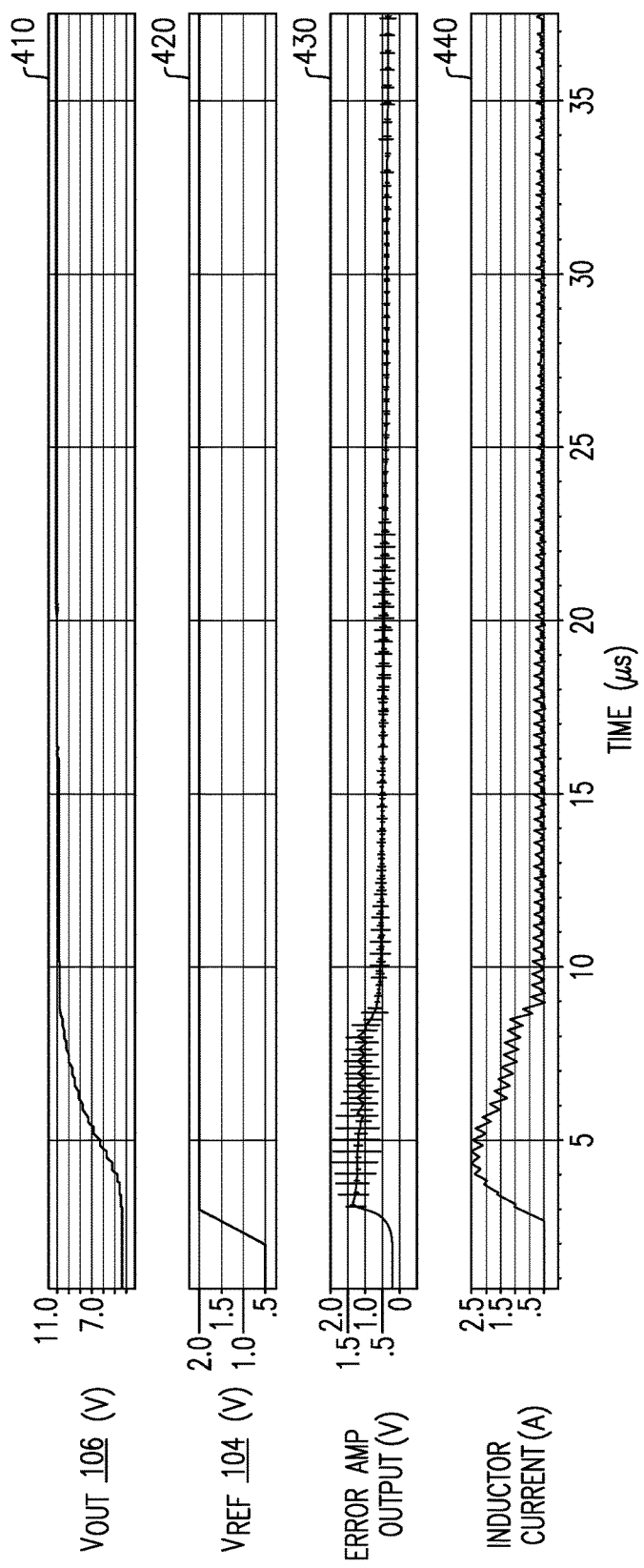
FIG. 4 shows example performance plots of the voltage boost assembly in FIG. 1 according to some implementations.

FIG. 4 shows example performance plots of the voltage boost assembly 100 in FIG. 1 according to some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, in some implementations, example performance plot 410 shows $V_{OUT}$ 106 over time. For example, as shown in example performance plot 410, $V_{OUT}$ 106 increases from approximately 3.8 V to 9.5 V in approximately 10 µs.

According to some implementations, example performance plot 420 shows $V_{REF}$ 104 versus time. For example, as shown in example performance plot 420, $V_{REF}$ 104 increases from approximately 0.5 V to 2.0 V.

According to some implementations, example performance plot 430 shows the output voltage of the error amplifier 136 versus time. For example, as shown in example performance plot 430, the output voltage of the error amplifier 136 is clamped at 1.2 V during the quick-start period between 5 and 10 µs.

According to some implementations, example performance plot 440 shows the current flowing through the inductive element 134 versus time. For example, as shown in example performance plot 440, the current flowing through the inductive element 134 is limited to 2.5 A during the quick-start period between 5 and 10 µs.

Figure 5:
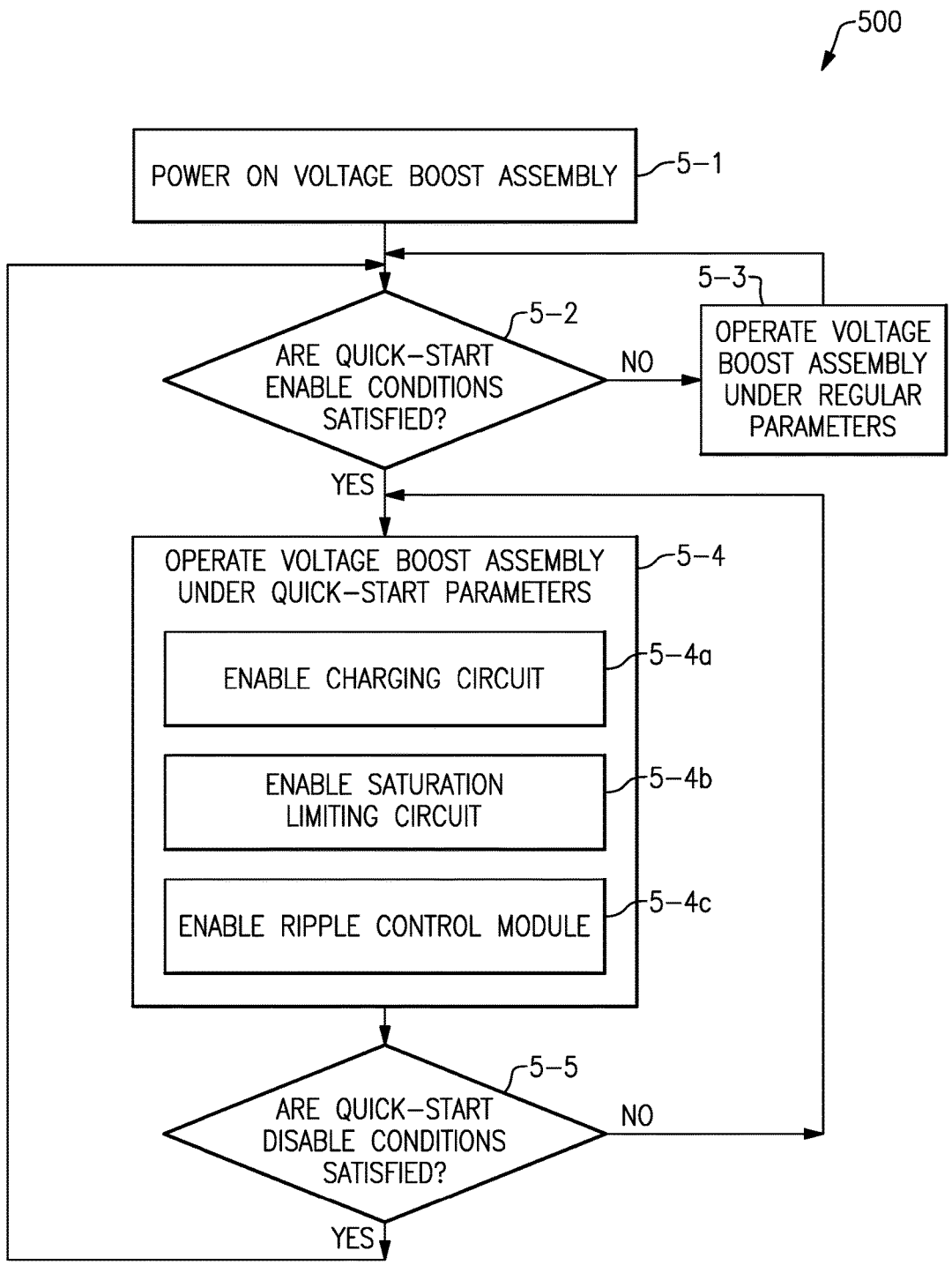
FIG. 5 is a flowchart representation of a method of operating the voltage boost assembly in FIG. 1 according to some implementations.

FIG. 5 is a flowchart representation of a method 500 of operating the voltage boost assembly 100 in FIG. 1 in accordance with some implementations. In some implementations, the method 500 is performed by the voltage boost assembly 100 in FIG. 1 or a controller associated therewith. While pertinent features are shown, those of ordinary skill in the art will appreciate from the present disclosure that various other features have not been illustrated for the sake of brevity and so as not to obscure more pertinent aspects of the example implementations disclosed herein. To that end, briefly, in some circumstances, the method 500 includes: powering on a voltage boost assembly; determining whether quick-start conditions are satisfied; operating the voltage boost assembly under regular parameters if the quick-start conditions are not satisfied; and operating the voltage boost assembly under quick-start parameters if the quick-start conditions are satisfied.

To that end, as represented by block 5-1, the method 500 includes powering on a voltage boost assembly. For example, with reference to FIG. 1, the voltage boost assembly 100 initiates operation when the associated device (e.g., a mobile phone or the like) is powered on. For example, with reference to FIG. 2, the voltage boost assembly 100 is powered on when the PFET associated with boost control 202 is in an "on" state, which allows current to flow from the inductive element 134 to the capacitive element 132.

As represented by block 5-2, the method 500 includes determining whether quick-start enable conditions are satisfied. For example, with reference to FIG. 1, the sensor assembly 110 senses whether an electrical condition relative to an electrical output of the boost converter (e.g., $V_{OUT}$ 106) has breached a first threshold. According to some implementations, for example, the quick-start enable conditions are satisfied when $V_{IN}$ 102<$V_{REF}$ 104 and 0.8*$V_{REF}$ 104>$V_{OUT}$ 106.

If the quick-start enable conditions are not satisfied, the method continues to block 5-3. If the quick-start enable conditions are satisfied, the method continues to block 5-4. For example, with reference to FIG. 1, the sensor assembly 110 generates a quick-start enable signal and provides the quick-start enable signal to the quick-start module 120 in response to sensing that the first threshold has been breached. According to some implementations, detecting that an electrical condition relative to an electrical output of the boost converter has breached the first threshold includes detecting that a reference voltage indicates demand for an output voltage that is at least 10% higher than the current output voltage. In some implementations, detecting that an electrical condition relative to an electrical output of the boost converter has breached the first threshold includes detecting that a reference voltage indicates demand for an output voltage that is at least 20% higher than the current output voltage. In another example, with reference to FIG. 3, when $V_{IN}$ 102<$V_{REF}$ 104 and 0.8*$V_{REF}$ 104>$V_{OUT}$ 106, the output of the AND gate 316 is logic high (e.g., 1) and the voltage boost assembly 100 operates under quick-start parameters.

As represented by block 5-3, the method 500 includes operating the voltage boost assembly under regular parameters.

As represented by block 5-4, the method 500 includes operating the voltage boost assembly under quick-start parameters. For example, with reference to FIG. 1, the quick-start module 120 is configured to drive the boost converter at a relatively high duty-cycle and so that the boost converter delivers an output current that satisfies a second threshold in order to charge a capacitive element arranged at the output in response to the quick-start enable signal. According to some implementations, the second threshold is characterized by a current level available to charge the capacitive element.

According to some implementations, as represented by block 5-4a, the method 500 includes enabling the charging circuit. For example, with reference to FIG. 1, the quick-start module 120 includes a charging circuit 122 provided to charge the capacitive element 132 so that the output of an associated error amplifier satisfies a third threshold in response to the quick-start enable signal. According to some implementations, the third threshold is characterized in relation to a high voltage level that can be sustained at the output of the error amplifier. In some implementations, the charging circuit 122 is configured to force the output of the error amplifier 136 to satisfy a predefined value (e.g., 1.1 V or 1.2 V). For example, in some implementations, this forces the error amplifier 136 to run at a duty cycle that satisfies a predefined threshold (e.g., 100% or maximum duty cycle).

According to some implementations, as represented by block 5-4b, the method 500 includes enabling the saturation limiting circuit. For example, with reference to FIG. 1, the quick-start module 120 includes a saturation limiting circuit 124 provided to limit current through the inductive element 134 of the boost converter 130 to establish the output current level in response to the quick-start enable signal. According to some implementations, the current through the inductive element 134 is limited to a level that is characterized by a saturation condition of the inductive element 134. In some implementations, the saturation limiting circuit 124 is configured to set a limit of the current flowing through the inductive element 134 to a predetermined output level (e.g., 2.5 A). For example, in some implementations, this prevents saturation of the inductive element 134.

According to some implementations, as represented by block 5-4c, the method 500 includes enabling the ripple control module. For example, with reference to FIG. 1, the quick-start module 120 includes a ripple control module 136 provided to reduce current ripple in the output current level by adjustment of a switching frequency in response to the quick-start enable signal. According to some implementations, the ripple control module 134 includes an oscillator 128 that provides switching frequency that is increased in response to the quick-start enable signal. In some implementations, ripple control module 126 is configured to increase the switching frequency of an oscillator 128 above a predetermined switching frequency (e.g., from 2 MHz to 2.5 MHz). For example, in some implementations, this reduces ripple in the current flowing through the inductive element 134.

As represented by block 5-5, the method 500 includes determining whether quick-start disable conditions are satisfied. For example, with reference to FIG. 1, the sensor assembly 110 is configured to turn off the quick-start enable signal in response to determining that the electrical output of the boost converter 130 (e.g., $V_{OUT}$ 106) satisfies a fourth threshold. In some implementations, the fourth threshold is approximately 95% of a set-point output level. According to some implementations, for example, the quick-start disable conditions are satisfied when $0.95*V_{REF}$ 104<$V_{OUT}$ 106 or $V_{IN}$ 102>$V_{REF}$ 104. For example, with reference to FIG. 3, when $V_{IN}$ 102>$V_{REF}$ 104 or $0.95*V_{REF}$ 104<$V_{OUT}$ 106, the output of the AND gate 316 is logic low (e.g., 0) and the voltage boost assembly 100 operates under regular parameters.

If the quick-start disable conditions are not satisfied, the method continues to block 5-4. If the quick-start disable conditions are satisfied, the method continues to block 5-2.

Figures 6A, 6B, 6C:
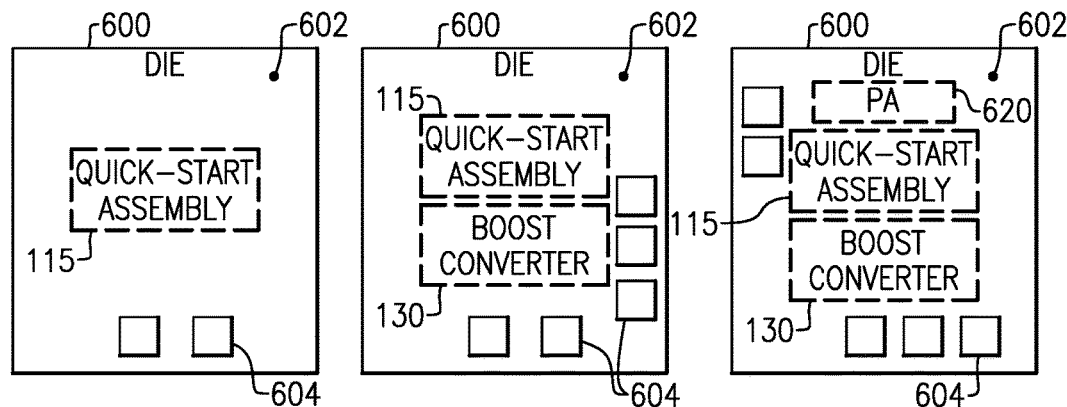
FIG. 6A-6C are block diagrams of different integrated circuit (IC) implementations of the voltage boost assembly in FIG. 1 according to some implementations.

FIGS. 6A-6C are block diagrams of various integrated circuits (ICs) according to some implementations. While some example features are illustrated, those skilled in the art will appreciate from the present disclosure that various other features have not been illustrated for the sake of brevity and so as not to obscure more pertinent aspects of the example implementations disclosed herein. To that end, for example, FIG. 6A shows that in some implementations, some or all portions of the quick-start assembly 115, which operates the voltage boost assembly 100 under quick-start parameters when quick-start conditions are satisfied, can be part of a semiconductor die 600. By way of an example, the quick-start assembly 115 can be formed on a substrate 602 of the die 600. A plurality of connection pads 604 can also be formed on the substrate 602 to facilitate functionalities associated with some or all portions of the quick-start assembly 115.

FIG. 6B shows that in some implementations, a semiconductor die 600 having a substrate 602 can include some or all portions of the quick-start assembly 115 and some or all portions of the boost converter 130, which operates according to conventional boost converter techniques. A plurality of connection pads 604 can also be formed on the substrate 602 to facilitate functionalities associated with some or all portions of the quick-start assembly 115 and some or all portions of the boost converter 130.

FIG. 6C shows that in some implementations, a semiconductor die 600 having a substrate 602 can include some or all portions of the quick-start assembly 115 and some or all portions of the boost converter 130, and some or all portions of the power amplifier (PA) 620. A plurality of connection pads 604 can also be formed on the substrate 602 to facilitate functionalities associated with some or all portions of the quick-start assembly 115 and some or all portions of the boost converter 130, and some or all portions of the PA 620.

Figure 7:
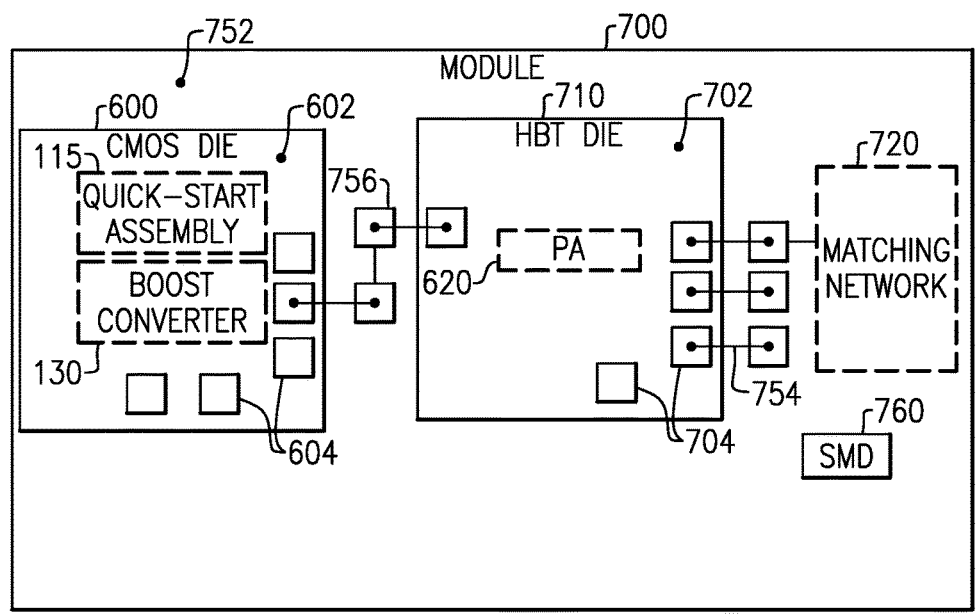
FIG. 7 is a block diagram of an example module according to some implementations.

In some implementations, one or more features described herein can be included in a module. FIG. 7 is a schematic diagram of an implementation of a module 700 including the voltage boost assembly 100 in FIG. 1 according to some implementations. While some example features are illustrated, those skilled in the art will appreciate from the present disclosure that various other features have not been illustrated for the sake of brevity and so as not to obscure more pertinent aspects of the example implementations disclosed herein. The module 700 includes a packaging substrate 752, connection pads 756, a CMOS (complementary metal-oxide semiconductor) die 600, a HBT (heterojunction bipolar transistor) die 710, a matching network 720, and one or more surface mount devices 760. In some implementations, the module 700 is at least one of a power amplifier module (PAM) or a front-end module (FEM).

The CMOS die 600 includes a substrate 602 including some or all portions of the bias circuit 200 and some or all portions of the bias circuit 610. A plurality of connection pads 604 is formed on the substrate 602 to facilitate functionalities associated with some or all portions of the quick-start assembly 115 and some or all portions of the boost converter 130. Similarly, the HBT die 710 includes a substrate 702 including some or all portions of the PA 620. The HBT die 710 also includes a plurality of connection pads 704 formed on the substrate 702 to facilitate functionalities associated with some or all portions of the PA 620.

The connection pads 756 on the packaging substrate 752 facilitate electrical connections to and from each of the CMOS die 600 and the HBT die 710. For example, the connection pads 756 facilitate the use of wirebonds 754 for passing various signals and supply currents and/or voltages to each of the CMOS die 600 and the HBT die 710.

In some implementations, the components mounted on the packaging substrate 752 or formed on or in the packaging substrate 752 can further include, for example, one or more surface mount devices (SMDs) (e.g., 760) and one or more matching networks (e.g., 720). In some implementations, the packaging substrate 752 can include a laminate substrate.

In some implementations, the module 700 can also include one or more packaging structures to, for example, provide protection and facilitate easier handling of the module 700. Such a packaging structure can include an overmold formed over the packaging substrate 752 and dimensioned to substantially encapsulate the various circuits and components thereon.

It will be understood that although the module 700 is described in the context of wirebond-based electrical connections, one or more features of the present disclosure can also be implemented in other packaging configurations, including flip-chip configurations.

Figure 8:
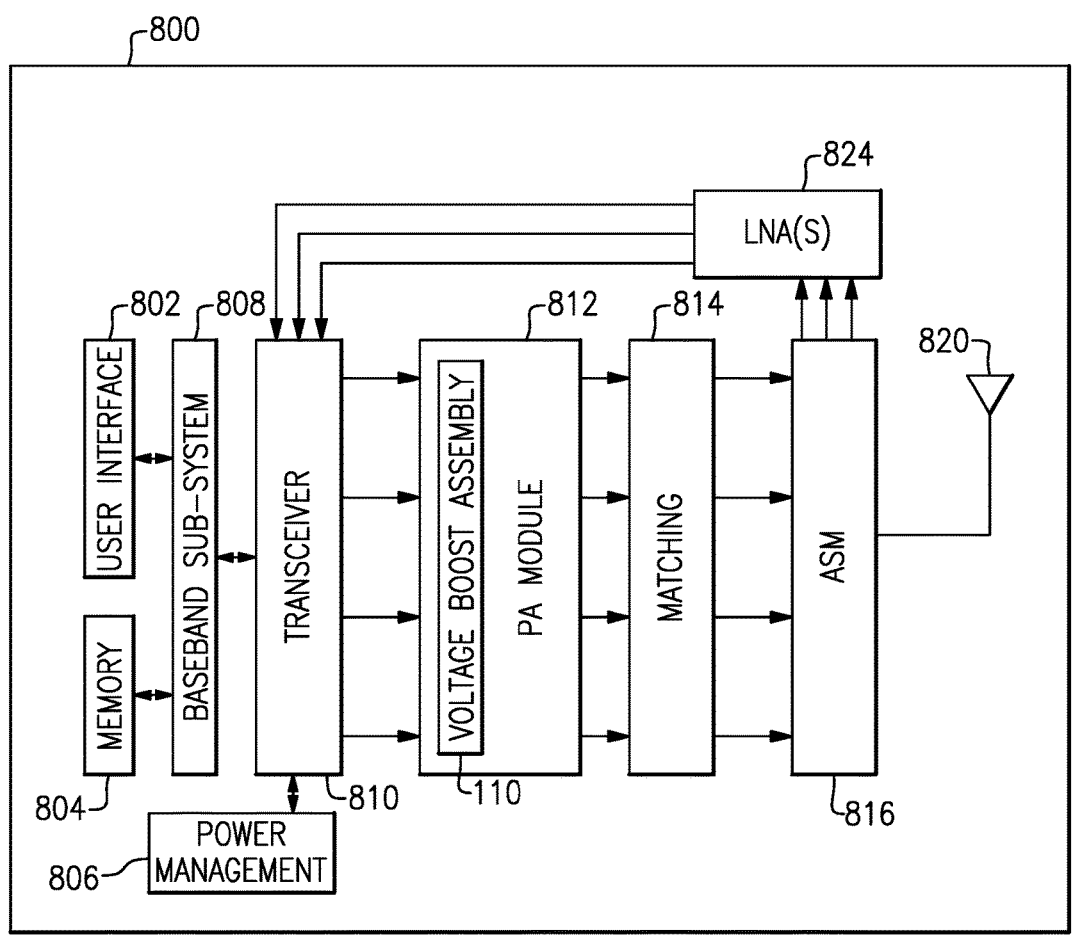
FIG. 8 is a block diagram of an example radio frequency (RF) device according to some implementations.

FIG. 8 schematically depicts an example radio-frequency (RF) device 800 having one or more advantageous features described herein. While pertinent features are shown, those of ordinary skill in the art will appreciate from the present disclosure that various other features have not been illustrated for the sake of brevity and so as not to obscure more pertinent aspects of the example implementations disclosed herein. To that end, in some implementations, the RF device 800 is a wireless device. In some implementations, such a wireless device can include, for example, a cellular phone, a smart-phone, a hand-held wireless device with or without phone functionality, a computer, a laptop, a tablet computer, a peripheral device, a router, a repeater, a wireless access point, a base station, or the like.

In some implementations the RF device 800 includes one or more power amplifier (PAs) (e.g., the PA 620 in FIGS. 6C and 7) in a PA module 812 configured to receive their respective RF signals from a transceiver 810 that can be configured and operated in known manners to generate RF signals to be amplified and transmitted, and to process received signals. In some implementations, the PA module 812 can include one or more filters and/or one or more band/mode selection switches configured to provide duplexing and/or switching functionalities as described herein. According to some implementations, the PA module 812 includes the voltage boost assembly 100 described above with reference to FIGS. 1-3. For example, the voltage boost assembly 100 operates under quick-start parameters (e.g., the quick-start module 120 is enabled) when the quick-start enable conditions are satisfied, and the voltage boost assembly 100 operates under regular parameters (e.g., according to conventional boost converter techniques) when the quick-start enable conditions are not satisfied.

The transceiver 810 is shown to interact with a baseband sub-system 808 that is configured to provide conversion between data and/or voice signals suitable for a user and RF signals suitable for the transceiver 810. The transceiver 810 is also shown to be connected to a power management component 806 that is configured to manage power for the operation of the RF device 800. In some implementations, the power management component 806 can also control operations of the baseband sub-system 808 and other components of the RF device 800.

The baseband sub-system 808 is shown to be connected to a user interface 802 to facilitate various input and output of voice and/or data provided to and received from the user. The baseband sub-system 808 can also be connected to a memory 18804 that is configured to store data and/or instructions to facilitate the operation of the wireless device, and/or to provide storage of information for the user.

In some implementations, a matching network 814 is provided between the PA module 812 and the antenna switch module (ASM) 816. In some implementations, the ASM 816 is connected to an antenna 820 and is configured to control which signals are transmitted via the antenna 820.

As shown in FIG. 8, some received signals via the antenna 820 are shown to be routed from the ASM 816 to one or more low-noise amplifiers (LNAs) 824. Amplified signals from the one or more LNAs 824 are shown to be routed to the transceiver 810.

A number of other wireless device configurations can utilize one or more features described herein. For example, the RF device 800 does not need to be a multi-band device. In another example, the RF device 800 can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some implementations of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of ramping up an output of a boost converter, the method comprising:
    sensing, at a sensor assembly coupled to the boost converter, that an electrical condition relative to an electrical output of the boost converter has satisfied a first threshold;
    generating, at the sensor assembly, a quick-start enable signal, as an output of the sensor assembly; and
    driving the boost converter, by a quick-start module responsive to the quick-start enable signal, to deliver an output current that satisfies a second threshold in order to charge a capacitive element arranged at the output of the boost converter.

2. The method of claim 1, wherein generating the quick-start enable signal includes generating the quick-start enable signal in response to sensing that the electrical condition has satisfied the first threshold.

3. The method of claim 1, wherein driving the boost converter includes charging the capacitive element by a charging circuit of the quick-start module so that an output of an error amplifier of the boost converter satisfies a third threshold.

4. The method of claim 3 wherein the third threshold is characterized in relation to a high voltage level that can be sustained at the output of the error amplifier.

5. The method of claim 3 wherein driving the boost converter includes limiting current through an inductive element of the boost converter.

6. The method of claim 5 wherein limiting current through the inductive element includes limiting current to a level characterized by a saturation condition of the inductive element.

7. The method of claim 1 wherein sensing that an electrical condition relative to the electrical output of the boost converter has satisfied the first threshold includes sensing that a reference voltage indicates demand for an electrical output that is at least 10% higher than the current electrical output of the boost converter.

8. The method of claim 1 wherein sensing that an electrical condition relative to an electrical output of the boost converter has satisfied the first threshold includes sensing that a reference voltage indicates demand for an electrical output that is at least 20% higher than the current electrical output of the boost converter.

9. The method of claim 1 wherein driving the boost converter includes increasing a switching frequency of the boost converter based at least in part on the quick-start enable signal.

10. The method of claim 1 wherein the second threshold is characterized by a current level available to charge the capacitive element.

11. The method of claim 1 further comprising turning off the quick-start enable signal in response to determining that the electrical output of the boost converter has satisfied a fourth threshold.

12. The method of claim 11 wherein the fourth threshold is approximately 95% of a set-point output level.

13. The method of claim 1 wherein driving the boost converter includes driving the boost converter at a higher duty-cycle so that the boost converter delivers the output current that satisfies the second threshold.

* * * * *